(12) United States Patent
Jeong

(10) Patent No.: US 8,040,293 B2
(45) Date of Patent: Oct. 18, 2011

(54) SHIFT REGISTER AND ORGANIC LIGHT EMITTING DISPLAY USING THE SAME

(75) Inventor: Jin Tae Jeong, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 949 days.

(21) Appl. No.: 11/833,454

(22) Filed: Aug. 3, 2007

(65) Prior Publication Data

US 2008/0062071 A1   Mar. 13, 2008

(30) Foreign Application Priority Data

Sep. 12, 2006   (KR) .................. 10-2006-0088093

(51) Int. Cl.
*G09G 3/14* (2006.01)
(52) U.S. Cl. ............... 345/46; 345/82; 345/100; 377/64
(58) Field of Classification Search .......... 345/82, 345/30–55, 59, 204–207; 377/64–81
See application file for complete search history.

(56) References Cited

U.S. PATENT DOCUMENTS

| | | | |
|---|---|---|---|
| 6,556,646 B1 | 4/2003 | Yeo et al. | |
| 7,786,972 B2 * | 8/2010 | Jeong et al. | 345/100 |
| 2004/0227718 A1 * | 11/2004 | Park | 345/100 |
| 2005/0156858 A1 | 7/2005 | Ahn et al. | |
| 2006/0092148 A1 * | 5/2006 | Ozawa et al. | 345/204 |
| 2006/0146978 A1 | 7/2006 | Jang | |

FOREIGN PATENT DOCUMENTS

| | | |
|---|---|---|
| CN | 1135625 | 11/1996 |
| EP | 0 731 441 | 9/1996 |
| EP | 731441 A2 * | 9/1996 |
| EP | 1 758 129 | 7/2008 |
| JP | 2000-155550 | 6/2000 |
| JP | 2003-248470 | 9/2003 |
| JP | 2006-107692 | 4/2006 |
| JP | 2006-190437 | 7/2006 |
| KR | 2005-65816 | 6/2005 |
| KR | 2005-121357 | 12/2005 |
| KR | 2006-27026 | 3/2006 |

OTHER PUBLICATIONS

Communication issued by the European Patent Office on Apr. 29, 2009. Japanese Office Action dated Jan. 12, 2010, in corresponding Japanese Patent Application No. 2007-013531.
Notice of Allowance issued in corresponding Korean Patent Application No. 2006-0088093 dated Dec. 21, 2007.
Patent Gazette issued on Jun. 9 2010, of the Chinese Patent Application No. 200710135882.2.

* cited by examiner

*Primary Examiner* — Alexander Eisen
*Assistant Examiner* — Christopher E Leiby
(74) *Attorney, Agent, or Firm* — Christie, Parker & Hale, LLP

(57) ABSTRACT

A shift register and an organic light emitting display using the same with a simplified design of a shift register having high reliance, and reduced dead space includes a plurality of stages dependently connected to a start pulse input line, each of the stages including: a voltage level controller to control voltage levels of first and second output nodes according to a start pulse or an output signal of a previous stage and a second clock signal; a control capacitor coupled between the first output node and an input line of a first clock signal; a first transistor coupled between a first power supply and a third output node and including a gate electrode coupled to the first output node; and a second transistor coupled between the third output node and an input line of the third clock signal and including a gate electrode coupled to the second output node.

19 Claims, 7 Drawing Sheets

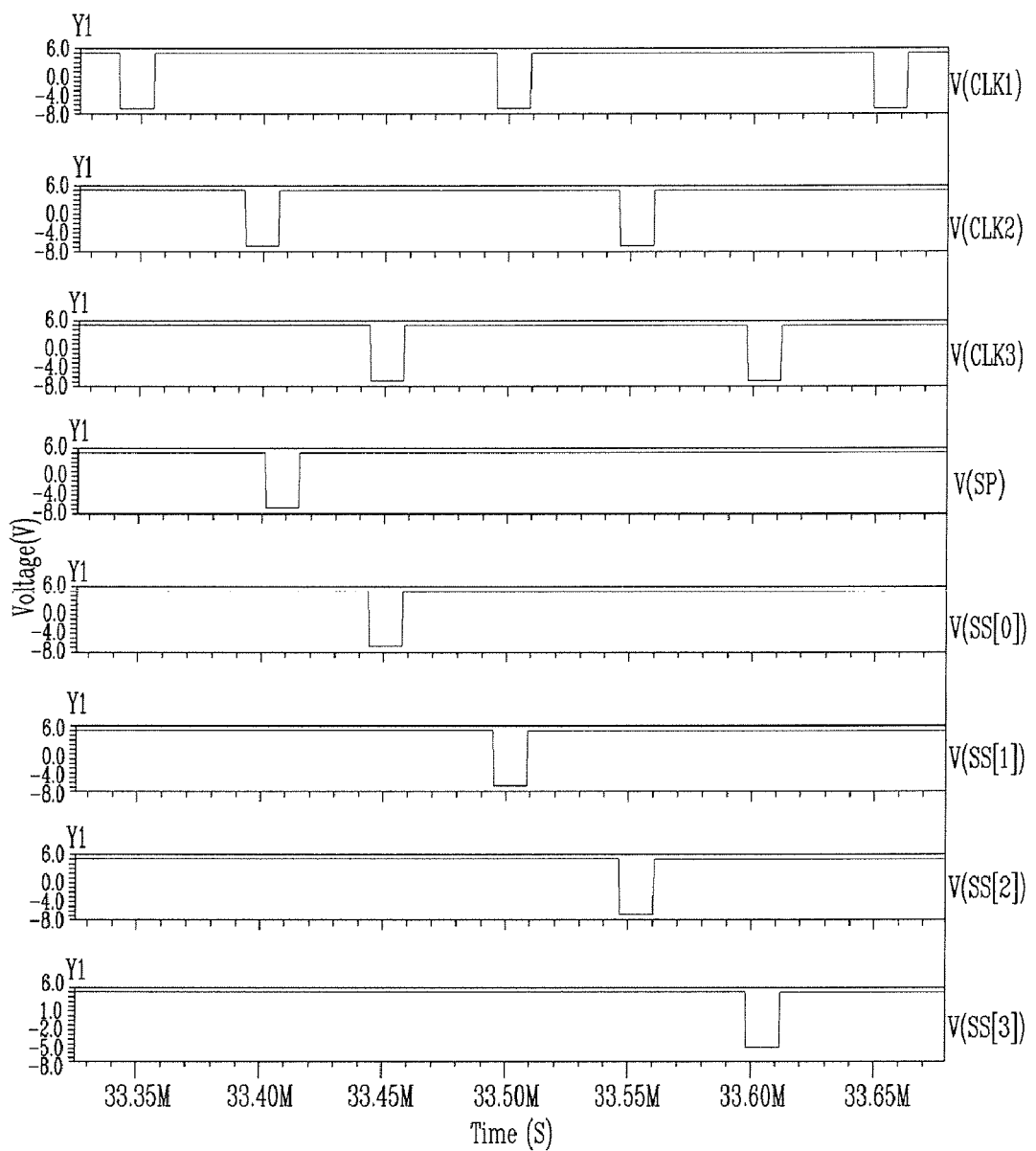

US 8,040,293 B2

SHIFT REGISTER AND ORGANIC LIGHT EMITTING DISPLAY USING THE SAME

CROSS-REFERENCE TO RELATED APPLICATION

This application claims the benefit of Korean Application No. 2006-88093, filed Sep. 12, 2006 in the Korean Intellectual Property Office, the disclosure of which is incorporated herein by reference.

BACKGROUND OF THE INVENTION

1. Field of the Invention

Aspects of the present invention relate to a shift register and an organic light emitting display using the same. More particularly, aspects of the present invention relate to a shift register and an organic light emitting display using the same, which has a simplified design and a reduced dead space.

2. Description of the Related Art

Generally, a flat panel display device, such an organic light emitting display, includes a pixel array in a matrix pattern arranged at intersections of data lines and scan lines. The scan lines constitute horizontal lines (row lines) of a matrix pixel portion, and are selected by a shift register to receive a predetermined scan signal.

FIG. 1 is a block diagram showing a related art shift register. With reference to FIG. 1, the related art shift register includes a plurality of stages (ST1 to STn), which are dependently connected to an input line of a start pulse SP.

The plurality of stages (ST1 to STn) sequentially shift a start pulse SP or an output signal of a previous stage to generate respective output signals (SS1 to SSn) corresponding to clock signals supplied from input lines of the clock signals (not shown). The respective output signals (SS1 to SSn) generated by the respective stages (ST1 to STn) are provided to a pixel array.

There is a need for a design of a shift register having high reliance, simplicity of design of the shift register, and a reduction of the dead space by way of a reduced number of wires, such as power supply lines.

SUMMARY OF THE INVENTION

Accordingly, aspects of the present invention provide a shift register and an organic light emitting display using the same with a shift register having a simple design, a high reliance, and a reduced dead space, and other advantages.

The foregoing and/or other aspects of the present invention include a shift register with a plurality of stages dependently connected to a start pulse input line, each of the stages including: a voltage level controller to control voltage levels of first and/or second output nodes according to a start pulse or an output signal of a previous stage and a second clock signal; a control capacitor coupled between the first output node and an input line of a first clock signal; a first transistor coupled between a first power supply and a third output node being an output node of the stage, and including a gate electrode coupled to the first output node; and a second transistor coupled between the third output node and an input line of the third clock signal, and including a gate electrode coupled to the second output node.

According to an aspect of the present invention, the control capacitor reduces a voltage of the first output node by a predetermined value when the first clock signal of a low level is inputted to the control capacitor. The voltage level controller includes: a third transistor coupled between an input line of the start pulse or an output signal of a previous stage and the second output node, and including a gate electrode coupled to an input line of the second clock signal; a fourth transistor coupled between the first power supply and the first output node, and including a gate electrode coupled to the input line of the start pulse or an output signal of a previous stage; and a fifth transistor coupled between the first power supply and the first output node, and including a gate electrode coupled to the second output node. The third, fourth, and/or fifth transistors may be formed of P-type transistors. The voltage level controller controls a voltage level of the second output node according to the start pulse or the output signal of a previous stage and the second clock signal, and controls a voltage level of the first output node according to the start pulse or the output signal of a previous stage and a voltage level of the second output node. The first and/or second transistors may be formed of P-type transistors. The first, second, and third clock signals have a waveform of a phase of which is sequentially delayed.

According to an aspect of the present invention, the shift register further comprises a first capacitor coupled between the second output node and the third output node. The shift register further comprises a second capacitor coupled between the first power supply and the first output node, and a third capacitor coupled between the first power supply and the second output node.

According to another aspect of the present invention, an organic light emitting display includes: a pixel portion including a plurality of pixels electrically connected to scan lines and data lines; a scan driver including a shift register to sequentially apply scan signals to the scan lines; and a data driver to apply a data signal to the data lines, wherein the shift register includes a plurality of stages dependently connected to a start pulse input line, each of the stages includes: a voltage level controller to control voltage levels of first and/or second output nodes according to a start pulse or an output signal of a previous stage and a second clock signal; a control capacitor coupled between the first output node and an input line of a first clock signal; a first transistor coupled between a first power supply and a third output node being an output node of the stage, and including a gate electrode coupled to the first output node; and a second transistor coupled between the third output node and an input line of the third clock signal, and including a gate electrode coupled to the second output node.

According to an aspect of the present invention, the control capacitor reduces a voltage of the first output node by a predetermined value when a first clock signal is inputted to the control capacitor. The voltage level controller includes: a third transistor coupled between an input line of the start pulse or an output signal of a previous stage and the second output node, and including a gate electrode coupled to an input line of the second clock signal; a fourth transistor coupled between the first power supply and the first output node, and including a gate electrode coupled to the input line of the start pulse or an output signal of a previous stage; and a fifth transistor coupled between the first power supply and the first output node, and including a gate electrode coupled to the second output node. The voltage level controller controls a voltage level of the second output node according to the start pulse or the output signal of a previous stage and the second clock signal, and controls a voltage level of the first output node according to the start pulse or the output signal of a previous stage and a voltage level of the second output node. The first, second, and third clock signals have a waveform of a phase of which is sequentially delayed. The organic light emitting display further includes a first capacitor coupled between the second output node and the third output node.

According to aspects of the present invention, a shift register includes a plurality of stages that are sequentially connected and a first stage being connected to a start pulse input line, each of the first and the plurality of stages including: first, second, and third clock signal input lines; an input line and an output line, wherein the input line of the stage is connected to the output line of the previous stage or the start pulse input line, and the input line corresponds to one of the first, second, and third clock signal input lines; and a voltage level controller to control voltage levels of the each stage according to an input line signal and a clock signal of the corresponding clock signal input line to output a pulse signal that corresponds to a clock signal of another one of the first, second, and third clock signal input line.

According to aspects of the present invention, a shift register includes a plurality of stages that are sequentially connected and a first stage being connected to a start pulse input line, each of the first and the plurality of stages including: first, second, and third clock signal input lines; and an input line and an output line, wherein the input line of the stage is connected to the output line of the previous stage or the start pulse input line, wherein the first clock signal input line supplies a low voltage first clock signal to the stage, the second clock signal input line supplies a second clock signal to selectively control an input signal of the input line, and the third clock signal input line supplies a third clock signal to selectively control output of the third clock signal through the output line of the stage.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which:

FIG. 7B is a view showing a simulation result of the circuit shown in FIG. 7A.

DETAILED DESCRIPTION OF THE EMBODIMENTS

Figure 1:
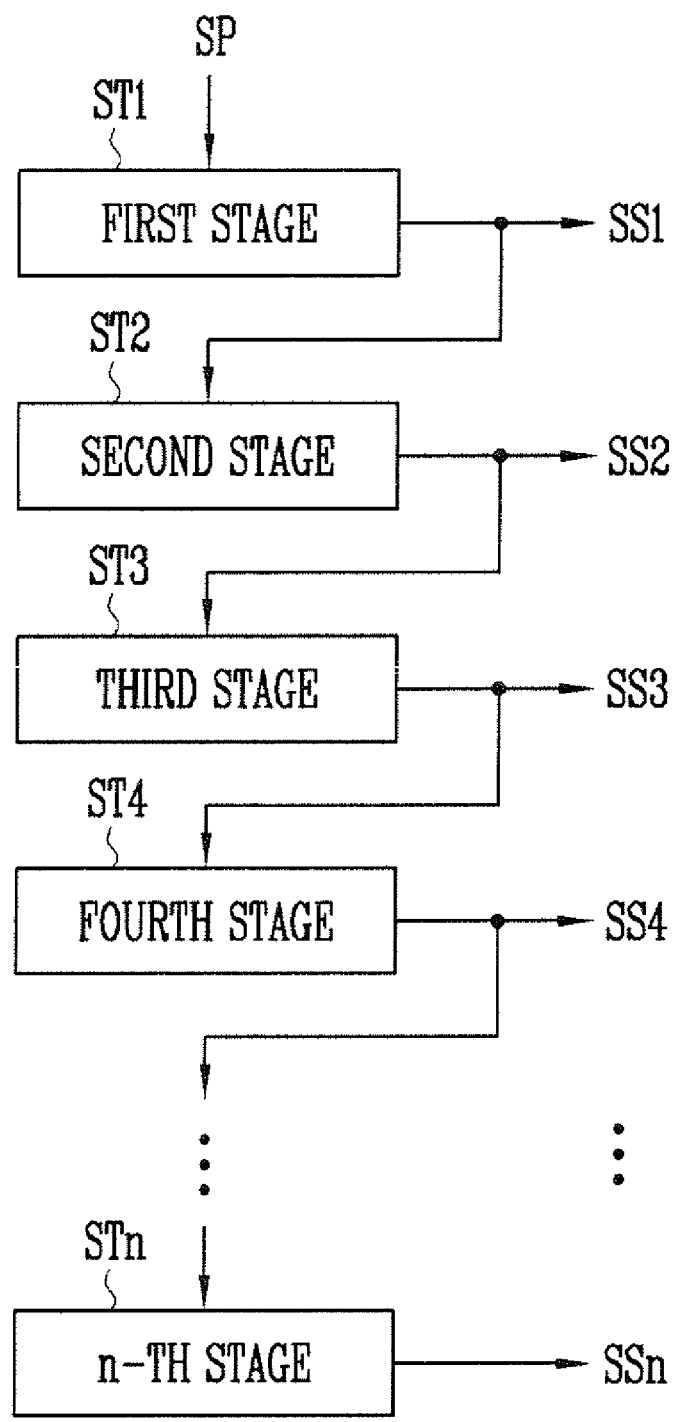
FIG. 1 is a block diagram showing a related art shift register.

Reference will now be made in detail to the aspects of the present invention, examples of which are illustrated in the accompanying drawings, wherein like reference numerals refer to the like elements throughout. The aspects are described below in order to explain the present invention by referring to the figures.

Hereinafter, aspects the present invention will be described with reference to the accompanying drawings, namely, FIG. 2 to FIG. 7B. In the following discussion, when one element is connected to another element, one element may not only be directly connected to another element but also be indirectly connected to another element via another element(s). Further, prior discussed elements are not repeated for clarity.

Figure 2:
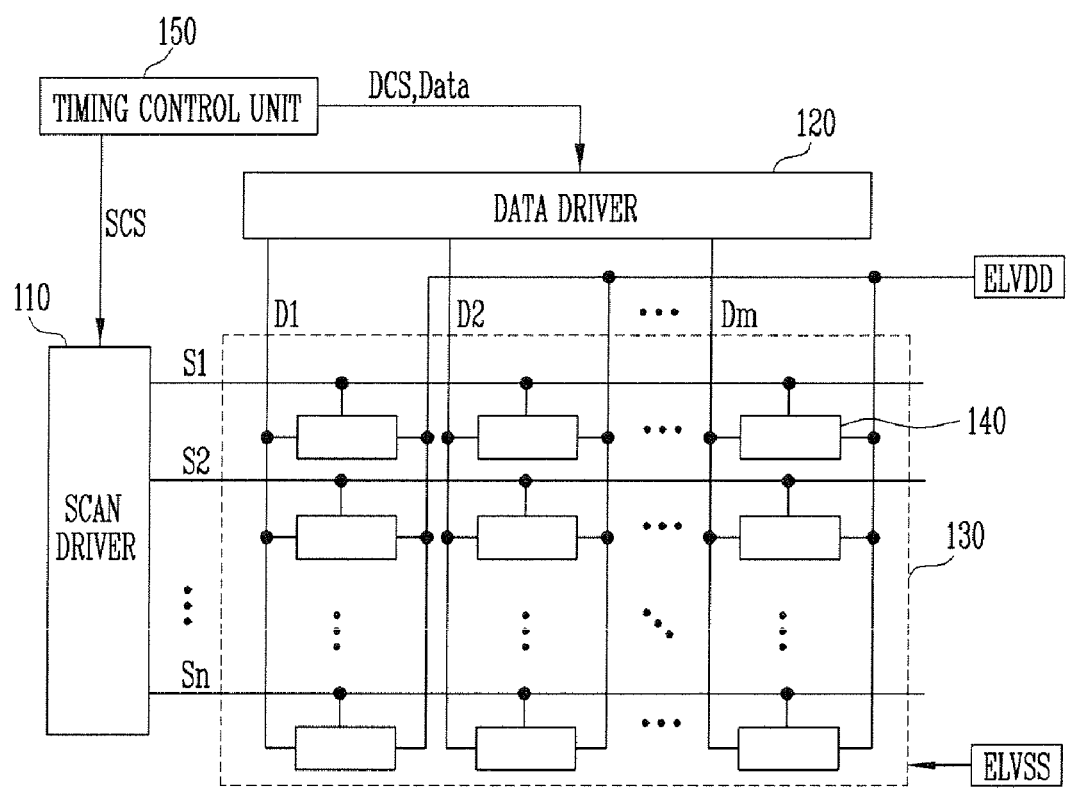
FIG. 2 is a block diagram showing an organic light emitting display according to an aspect of the present invention.

FIG. 2 is a block diagram showing an organic light emitting display according to an aspect of the present invention. The organic light emitting display includes a pixel portion 130 including pixels 140 formed in areas divided (or defined) by scan lines S1 through Sn and data lines D1 through Dm, a scan driver 110 to drive the scan lines S1 through Sn, a data driver 120 to drive the data lines D1 through Dm, and a timing control unit 150 to control the scan driver 110 and the data driver 120.

As shown, the scan driver 110 receives scan control signals SCSs including a start pulse SP and a clock signal CLK from the timing control unit 150 to generate (or output) scan signals, and provides the scan signals to the scan lines S1 to Sn. In order to do this, the scan driver 110 includes a shift register, which sequentially generates the scan signals in accordance with the start pulse SP and the clock signal CLK and provides the scan signals to the scan lines S1 to Sn.

As shown, the data driver 120 receives the data control signal DCS and data (Data) from the timing control unit 150, and generates a data signal. The data signal is provided to the data lines D1 to Dm in synchronization with the scan signal.

The timing control unit 150 generates (or outputs) scan control signals SCSs and a data control signal DCS according to externally supplied signals, which may be synchronous thereto. The scan control signals SCSs generated by the timing control unit 150 are provided (or applied) to the scan driver 110, and the data control signal DCS generated (or output) by the timing controller 150 is provided (or applied) to the data driver 120. Furthermore, the timing control unit 150 provides (or outputs) externally supplied data (Data) to the data driver 120.

The pixel portion 130 includes a plurality of pixels 140, which respectively are electrically connected to the scan lines S1 to Sn and the data lines D1 to Dm. Each of the pixels 140 receives a voltage of a first pixel power supply ELVDD and a voltage of a second pixel power supply ELVSS from an exterior thereof, and receives a scan signal and a data signal from the scan driver 110 and the data driver 120, respectively. When one or more of the pixels 140 receive the voltage of a first pixel power supply ELVDD, the voltage of a second pixel power supply ELVSS, the scan signal, and/or the data signal, one or more of the pixels are selected by the scan signal and light corresponding to the data signal is generated (or output) therefrom, in the shown aspect.

Figure 3:
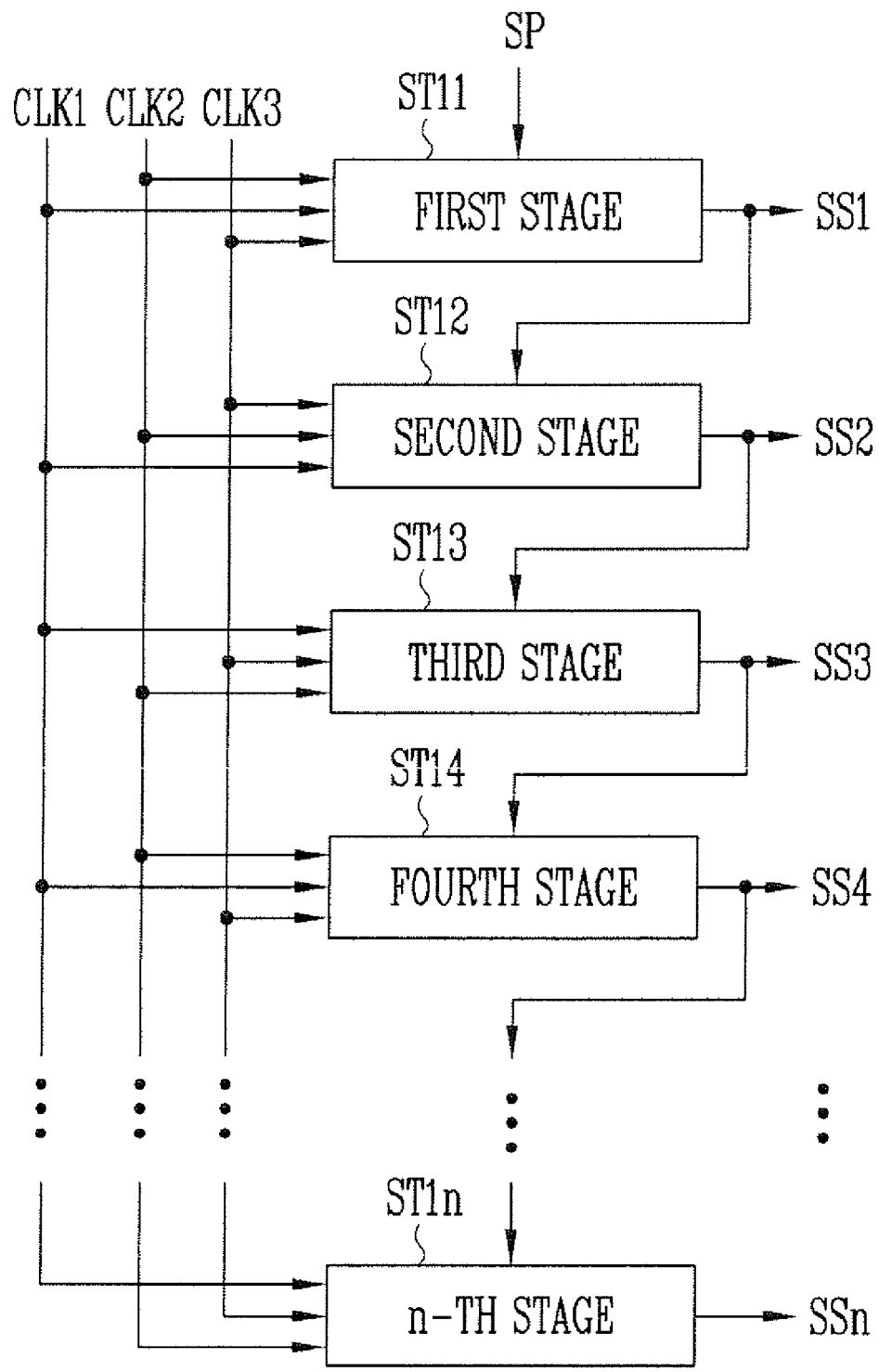
FIG. 3 is a block diagram showing a shift register according to an aspect of the present invention included in the scan driver shown in FIG. 2.

FIG. 3 is a block diagram showing a shift register according to an aspect of the present invention included in the scan driver shown in FIG. 2. With reference to FIG. 3, the shift register includes a plurality of stages ST11 to ST1n, which are dependently connected to an input line of a start pulse SP and three clock signal supply lines CLK1 to CLK3. Here, three clock signals CLK1, CLK2, and CLK3 are supplied in such a manner that phases (or pulses) of the three clock signals CLK1, CLK2, and CLK3 are sequentially delayed. In other aspects, the three clocks signals CLK1, CLK2, and CLK3 are applied sequentially and/or periodically. In various aspects, the clock signal supply lines CLK1, CLK2, and CLK3 may be connected to each of the stages ST11 to ST1n identically, or may be connected differently, such as a different sequential order, a non-limiting aspect of which is shown in FIG. 3.

In the non-limiting aspect shown, the first stage ST11 delays a phase of the start pulse SP supplied thereto by one clock and outputs the phase-delayed start pulse in response to first to third clock signals CLK1 to CLK3. Each of the second to n-th stages ST12 to ST1n delays a phase of an output signal SSi−1 of a previous stage supplied thereto by one clock and outputs the phase-delayed output signal in response to the first to third clock signals CLK1 to CLK3. Accordingly, by the aforementioned operations thereof, the stages ST11 to ST1n sequentially generate (or output) respective phase-delayed output signals SS1 to SSn, and sequentially provide the generated output signals SS1 to SSn to the respective scan lines (S1 to Sn shown in FIG. 2).

In the non-limiting aspect shown in FIG. 3, a shift register is driven by the sequentially phase-delayed three clock signals CLK1 to CLK3. However, in other aspects, the shift register can be driven by sequentially phase-delayed four or more clock signals. In this case, each stage STi may receive only three of the four clock signals and generate an output signal SSi corresponding thereto. For example, a first stage ST11 may receive first, third, and fourth clock signals, while a second stage ST12 may receive the second, fourth, and first clock signals, which are obtained by sequentially delaying phases of the first, third, and fourth clock signals, respectively by one clock. In the same manner, each of the third to n-th stages ST13 to ST1n respectively may sequentially receive three phase-delayed clock signals that are delayed by one clock from those of the previous stage.

Figure 4:
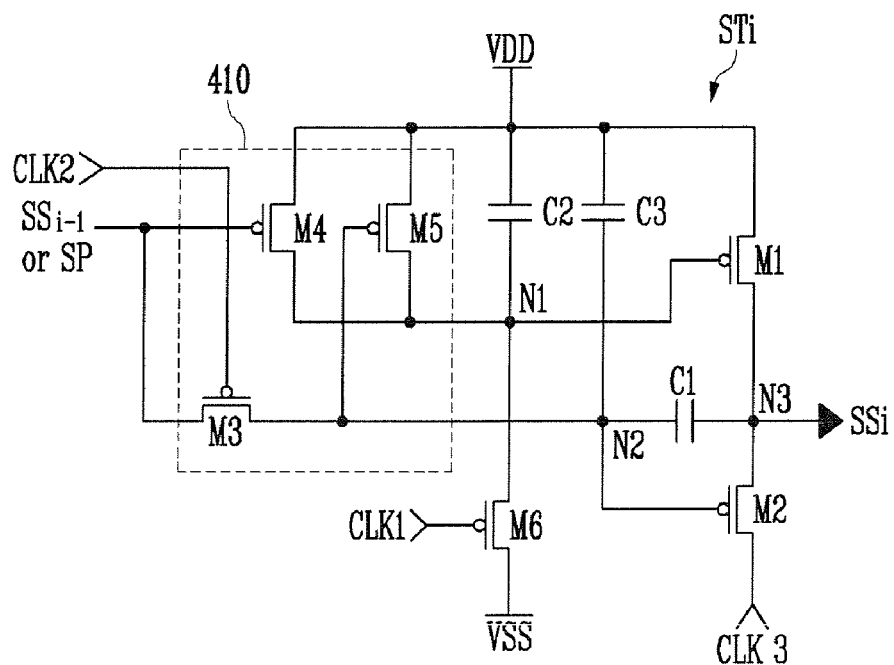
FIG. 4 is a detailed circuitry diagram showing an aspect of a representative stage of the shift register shown in FIG. 3.

FIG. 4 is a detailed circuitry diagram showing an aspect of a representative stage of the shift register shown in FIG. 3. With reference to FIG. 4, the representative stage STi includes a voltage level controller 410, first, second, and sixth transistors M1, M2, and M6, and first, second, and third capacitors C1, C2, and C3.

In the non-limiting aspect shown, the voltage level controller 410 controls a voltage level of a first node (first output node) N1 and a voltage level of a second node (second output node) N2 to be output as a high level or a low level.

More particularly, the voltage level controller 410 controls a voltage level of the second node (second output node) N2 according to the start pulse SP or an output signal SSi−1 of a previous stage. The voltage level controller 410 also controls a voltage level of the first node (first output node) N1 according to the start pulse SP or an output signal SSi−1 of a previous stage and the voltage level of the second node N2.

Accordingly, in the non-limiting aspect shown, the voltage level controller 410 includes third, fourth, and fifth transistors M3, M4, and M5. In a non-limiting aspect, the third, fourth, and fifth transistors M3, M4, and/or M5 are formed of P-type transistors.

As shown, the third transistor M3 is coupled between an input line of the start pulse SP or an output signal SSi−1 of a previous stage, and the second node N2. A gate electrode of the third transistor M3 is coupled to an input line of the second clock signal CLK2. When the second clock signal CLK2 of a low level is supplied to the gate electrode of the third transistor M3, the third transistor M3 is turned-on and supplies the start pulse SP or the output signal SSi−1 of a previous stage to the second node N2.

As shown, the fourth transistor M4 is coupled between a first power supply VDD and the first node N1. A gate electrode of the fourth transistor M4 is coupled to the input line of the start pulse SP or the output signal SSi−1 of a previous stage. When the start pulse SP or the output signal SSi−1 of a previous stage having a low level is inputted to the gate electrode of the fourth transistor M4, the fourth transistor M4 is turned-on and electrically connects the first node N1 to the first power supply VDD.

As shown the fifth transistor M5 is coupled between the first power supply VDD and the first node N1. A gate electrode of the fifth transistor M5 is coupled to the second node N2. When a voltage level of the second node N2 drops to be equal to or less than a predetermined value, the fifth transistor M5 electrically connects the first node N1 to the first power supply VDD.

That is, the voltage level controller 410 controls a voltage level of the first node N1 and the voltage level of the second node N2 according to the start pulse SP or the output signal SSi−1 of a previous stage and the second clock signal CLK2.

As shown, the first transistor M1 is coupled between the first power supply VDD, which is a high level voltage source, and a third node (third output node) N3, which is an output node of the stage STi. A gate electrode of the first transistor M1 is coupled to the first node N1. When a voltage level of the first node N1 is low (namely, when a voltage of the first node N1 is less than that of a source electrode of the first transistor M1), the first transistor M1 is turned-on and electrically connects an output line of the stage STi to the first power supply VDD.

As shown, the second transistor M2 is coupled between the third node N3 and an input line of the third clock signal CLK3. A gate electrode of the second transistor M2 is coupled with the second node N2. When a voltage level of the second node N2 is low, the second transistor M2 is turned-on and electrically connects an output line of the stage STi to an input line of the third clock signal CLK3. That is, when the second transistor M2 is turned-on, a voltage level of the output signal SSi of the stage STi becomes identical with that of the third clock signal CLK3.

In the non-limiting aspect shown, the first and second transistors M1 and/or M2 are formed of P-type transistor.

As shown, the sixth transistor M6 is coupled between the first node N1 and a second power supply VSS, which is a low level voltage source that is less than that of the first power supply VDD. A gate electrode of the sixth transistor M6 is coupled to an input line of the first clock signal CLK1. When the first clock signal CLK1 of a low level is inputted to the input line of the first clock signal CLK1, the sixth transistor M6 is turned-on and electrically connects the first node N1 to the second power supply VSS. In the non-limiting aspect shown, the sixth transistor M6 is formed of P-type transistors.

As shown, the first capacitor C1 is coupled between the second node N2 and the third node N3. The first capacitor C1 is charged with a predetermined voltage corresponding to a potential difference between both terminals thereof in order to stabilize an operation of the second transistor M2.

As shown, the second capacitor C2 is coupled between the first power supply VDD and the first node N1.

As shown, the third capacitor C3 is coupled between the first power supply VDD and the second node N2.

The second and third capacitor C2 and C3 reduce a variation of (or to stabilize) a voltage, which is applied to the first power supply VDD, the first node N1, and/or the second node N2.

As is seen from the forgoing descriptions thereof, when a circuit of the stages STi is designed, a shift register is constructed using a relatively small number of elements, namely, a relatively small number of transistors M and capacitors C, to thereby easily design the shift register and to reduce dead space (or to make compact). Further, a manufacturing process thereof is simplified by designing the transistors M1 to M6 included in a representative stage STi with the same conductive type.

In particular, in a flat panel display such as an active matrix type organic light emitting display, a pixel array includes P-type transistors. When stages included in a shift register of a scan driver are constructed by transistors having the same conductive type as that of transistors included in the pixel array, the shift register can be formed simultaneously with the pixel array formed on a substrate. Accordingly, a manufacturing process of the flat panel display is simplified and eased in order to enhance the efficiency thereof.

That is, in the non-limiting aspect shown, the shift register is formed on the substrate together with the pixel array. However, aspects of the present invention are not limited thereto. For example, the shift register may be mounted on a chip and be mounted on a substrate on which the pixel array is formed.

Additionally, in the non-limiting representative stage STi shown in FIG. 4, the first, second, and third clock signals CLK1, CLK2, and CLK3 are supplied to one electrode of the sixth, third, and second transistor M6, M3, and M2, respectively. However, in other aspects, the first, second, and third clock signals CLK1, CLK2, and CLK3 may be supplied and shifted by one clock for respective stages. For example, in an immediate next stage of the representative stage STi shown in FIG. 4, the second, third, and first clock signals CLK2, CLK3, and CLK1 (which are clock signals respectively shifted by one clock from that of first, second, and third signals) may be supplied to respective one electrode of the sixth, third, and second transistor M6, M3, and M2, respectively. To enable supply of such shifted clock signals, the respective clock signal supply lines may be arranged accordingly to supply the second, third, and first clock signals CLK2, CLK3, and CLK1.

Figure 5:
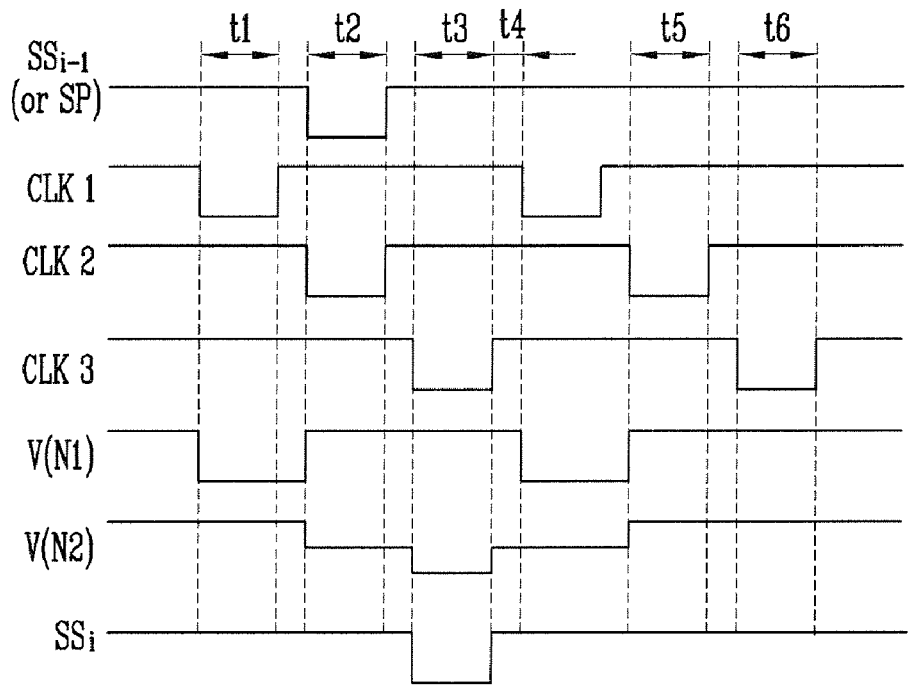
FIG. 5 is an input/output signal waveform diagram of the representative stage shown in FIG. 4.

The following is a description of an operation of the representative stage STi shown in FIG. 4 with reference to the input/output signal waveform shown in FIG. 5. For sake of convenience and brevity, discussion below will not consider factors such as a threshold voltage of transistors.

Referring to FIG. 5, first, during a t1 period, an output signal SSi−1 of a previous stage (or start pulse SP) of a high level is supplied to a source electrode of the third transistor M3 and a gate electrode of the fourth transistor M4. Moreover, the first clock signal CLK1 of a low level is supplied to a gate electrode of the sixth transistor M6, and the second clock signal CLK2 and the third clock signal CLK3 of the high level are supplied to a gate electrode of the third transistor M3 and a drain electrode of the second transistor M2, respectively in this aspect, the first, second, and third clock signals CLK1, CLK2, and CLK3 have a waveform of a sequentially delayed phase.

Accordingly, the third and fourth transistor M3 and M4 maintain an off state, and the sixth transistor M6 is turned-on. When the sixth transistor M6 is turned-on, a voltage of the second power supply VSS is transferred to the first node N1. Therefore, during the t1 period, the first node N1 is charged (supplied or applied) with a low level voltage.

At this time, as the voltage of the first node N1 drops to a low level, the first transistor M1 is turned-on to supply the voltage of the first power supply VDD to an output line of the stage STi. Accordingly, the output signal SSi of the stage STi maintains a high level during the t1 period. Additionally, the voltage charged (supplied or applied) in the second node N2 maintains a high level without variation (or distortions).

Next, during t2 period, an output signal SSi−1 of a previous stage (or start pulse SP) of a low level is supplied to a source electrode of the third transistor M3 and a gate electrode of the fourth transistor M4.

Moreover, the first clock signal CLK1 of a high level is supplied to a gate electrode of the sixth transistor M6, and the second clock signal CLK2 of a low level and the third clock signal CLK3 of the high level are supplied to the gate electrode of the third transistor M3 and the drain electrode of the second transistor M2, respectively.

Accordingly, the third transistor M3 is turned-on according to the second clock signal CLK2 of a low level, and transfers a low level (voltage or phase) of the output signal SSi−1 of a previous stage (or start pulse SP) to the second node N2 so that the second node N2 is charged with the low level thereof.

Further, as the fourth transistor M4 is turned-on according to the low level of the output signal SSi−1 of a previous stage (or start pulse SP) and the second node N2 is charged with the low level thereof, the fourth transistor M4 is turned-on, and charges (supplies or applies) the first node N1 with a high level voltage of the first power supply VDD.

As the first node N1 is charged with the high level voltage, the first transistor M1 is turned-off. As the second node N2 is charged with the low level voltage, the second transistor M2 is turned-on, so that the third clock signal CLK3 of a high level is supplied to an output line of the stage STi. At this time, a voltage capable of turning-on the second transistor M2 is stored (or charged) in the first capacitor C1.

Next, during t3 period, an output signal SSi−1 of a previous stage (or start pulse SP) of a high level is supplied to the source electrode of the third transistor M3 and the gate electrode of the fourth transistor M4.

Furthermore, the first and second clock signals CLK1 and CLK2 of a high level are respectively supplied to a gate electrode of the sixth transistor M6 and a gate electrode of the third transistor M3, and the third clock signal CLK3 of the low level is provided to the drain electrode of the second transistor M2.

Accordingly, the third, fourth, and sixth transistors M3, M4, and M6 are turned-off according to the output signal SSi−1 of a previous stage (or start pulse SP) of a high level, and the high level of the first and second clock signals CLK1 and CLK2.

In addition, because the voltage capable of turning-on the second transistor M2 was stored (or charged) in the first capacitor C1 during the previous time period of t2, the second transistor M2 maintains an on state. Accordingly, a waveform in the output signal SSi of the stage STi depends on that of the third clock signal CLK3. Namely, the output signal SSi of the stage STi has a low level during the t3 period.

At this time, as the third clock signal CLK3 changes from a high level to a low level, through a coupling of a capacitor of gate-source of the second transistor M2, the second node N2 is charged with a level (or voltage level) less than the low level thereof during the t2 period.

Accordingly, the fifth transistor M5 that is connected to the second node N2 is turned-on, to thereby charge (or apply) a high level voltage VDD to the first node N1.

Thereafter, during t4 period, an output signal SSi−1 of the previous stage (or start pulse SP) of a high level is supplied to the source electrode of the third transistor M3 and the gate electrode of the fourth transistor M4.

Furthermore, the first, second, and third clock signals CLK1, CLK2, and CLK3 of a high level are respectively supplied to a gate electrode of the sixth transistor M6, a gate electrode of the third transistor M3, and a drain electrode of the second transistor M2.

Accordingly, the third, fourth, and sixth transistors M3, M4, and M6 maintain a turning-off state according to the output signal SSi−1 (or start pulse SP) of a previous stage of a high level, and the first and second clock signals CLK1 and CLK2.

In addition, the second transistor M2 maintains an on state by way of the first capacitor C1. Accordingly, the output signal SSi of the stage STi has a high level according to a waveform of the third clock signal CLK3.

At this time, by way of a coupling of a capacitor of gate-source of the second transistor M2, the second node N2 is charged with a level that is a predetermined value higher than that of the low level occurring during the t2 period and charged with an intermediate level voltage, which is similar or identical with a value thereof occurring during the t2 period. Accordingly, the fifth transistor M5 maintains a turned-on state, so that the first node N1 maintains a high level.

During next time periods, since the output signal SSi−1 of the previous stage (start pulse SP) maintains a high level, the output signal SSi of the stage STi also maintains the high level.

For example, during t5 period, although the second clock signal CLK2 of a low level is supplied, because the output signal SSi−1 of the previous stage (start pulse SP) supplied through the third transistor M3 continues to maintain a high level, the second node N2 is charged with a high level, with the result that a voltage capable of turning-off the second transistor M2 is applied to the second node N2 (or stored in the first capacitor C1). Next, during t6 period, although the third clock signal CLK3 of a low level is supplied, the second transistor M2 maintains a turned-off state, so that the output signal SSi of the representative stage STi maintains a high level regardless of a level of the third clock signal CLK3 due to the high level of the second node N2 (or the first capacitor C1).

In the aforementioned operations thereof, the various stages ST11 to ST1n of the shift register each delay a phase of the output signal SSi−1 of the previous stage (start pulse SP) that is supplied thereto by one clock in response to first, second, and/or third clock signals CLK1, CLK2, and/or CLK3, and outputs the phase-delayed signal to a respective output line SS1 to SSn.

Figure 6:
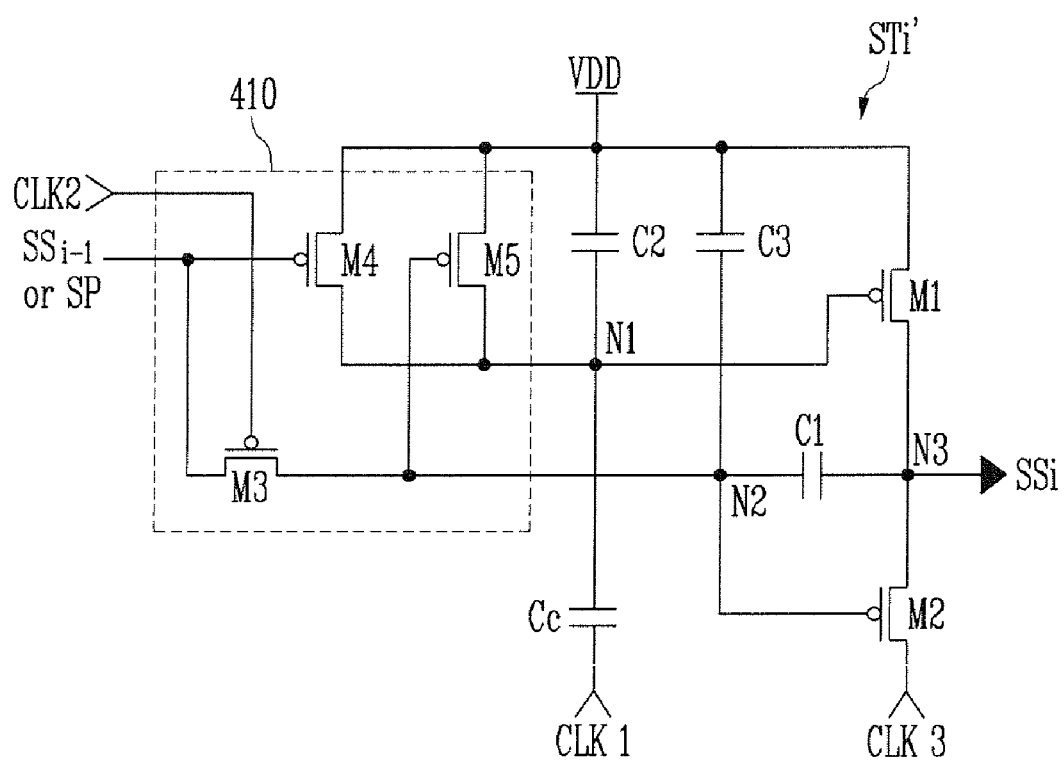
FIG. 6 is a detailed circuitry diagram showing another aspect of a representative stage of the shift register shown in FIG. 3.

FIG. 6 is a detailed circuitry diagram showing another aspect of a representative stage of the shift register shown in FIG. 3.

With reference to FIG. 6, a representative stage STi' comprises a voltage level controller 410 to control the voltage levels of first and second nodes (first and second output nodes) N1 and N2 according to a start pulse SP or an output signal SSi−1 of a previous stage and a second clock signal CLK2; a control capacitor Cc coupled between the first node N1 and an input line of a first clock signal CLK1; a first transistor M1 coupled between a first power supply VDD and a third node (third output node) N3 that is an output node of the stage STi and includes a gate electrode coupled to the first output node N1; and a second transistor M2 coupled between the third output node N3 and an input line of the third clock signal CLK3 and includes a gate electrode coupled to the second output node N3.

In the non-limiting aspect shown, the first and/or second transistors M1, M2 are formed of P-type transistors. The first, second, and third clock signals CLK1, CLK2, and CLK3 have a waveform of a sequentially delayed phase.

As shown, the voltage level controller 410 includes: a third transistor M3 coupled between an input line of the start pulse SP or an output signal SSi−1 of a previous stage and the second node N2 and includes a gate electrode coupled to an input line of the second clock signal CLK2; a fourth transistor M4 coupled between the first power supply VDD and the first node N1 and includes a gate electrode coupled to the input line of the start pulse SP or an output signal SSi−1 of a previous stage; and a fifth transistor M5 coupled between the first power supply VDD and the first node N1 and includes a gate electrode coupled to the second node N2. Here, the respective third, fourth, and fifth transistors M3, M4, and/or M5 are formed of P-type transistors.

As shown, the voltage level controller 410 controls a voltage level of the second node N2 according to the start pulse SP or the output signal SSi−1 of a previous stage and the second clock signal CLK2, and controls a voltage level of the first node N1 according to the start pulse SP or the output signal SSi−1 of a previous stage and a voltage level of the second node N2.

Moreover, the representative stage STi' further comprises a first capacitor C1 coupled between the second node N2 and the third node N3, a second capacitor C2 coupled between the first power supply VDD and the first node N1, and a third capacitor C3 coupled between the first power supply VDD and the second node N2.

In the representative stage STi' according to the aspect of FIG. 6, the structures and the operations of the voltage level controller 410, the first and second transistors M1 and M2, and the first to third capacitors C1 to C3 are identical to those shown in the aspect of FIG. 4. Accordingly, like or the same elements are designated by like or the same numerals. Description of those similar elements or components will not be repeated.

However, unlike the representative stage STi of the aspect of FIG. 4, the representative stage STi' of the aspect of FIG. 6 is not connected to a second power supply VSS that is a low level voltage source.

In the aspect of FIG. 4, the first node N1 is connected to the second power supply VSS, by way of the sixth transistor M6. When the first clock signal CLK1 has a low level, the sixth transistor M6 charges the first node N1 with a low level voltage of the second power supply VSS. In contrast, in the aspect of FIG. 6 without the sixth transistor M6, a control capacitor Cs is coupled between the first node N1 and the first clock signal CLK input line that is provided thereto.

As shown in FIG. 6, when the first clock signal CLK1 of a low level is inputted to the control capacitor Cc, particularly, while the phase of the first clock signal CLK1 drops from a high level to a low level, the control capacitor Cc is charged with a low value of voltage obtained by reducing a voltage of the first node N1 by a predetermined value by way of the coupling.

In detail, when the start pulse SP or an output signal SSi−1 of a previous stage and the first to third clock signals CLK1 to CLK3 as shown in FIG. 5 are supplied to the representative stage STi', the control capacitor Cc functions to reduce a voltage level of the first node N1 to a low value by way of the coupling during the t1 period, which is a period when the first clock signal CLK1 supplies a low level voltage.

That is, the control capacitor Cc performs the same function as that of the sixth transistor M6 of the aspect of FIG. 4, yet does not need the second power supply VSS of the aspect of FIG. 4 where once the first clock signal CLK1 of a low level is supplied, the sixth transistor M6 electrically connects the first node N1 to the second power supply VSS that is a low level voltage source to reduce a voltage level of the first node N1 to a low value.

In this aspect, since an input/output signal waveform of the representative stage STi' is identical with that shown in FIG.

5, a detailed description of an operation of the stage STi' during respective time periods is not repeated.

In the representative stage STi' according to the aforementioned aspect of FIG. 6, the number of power supply lines is reduced by removing the second power supply VSS. This causes a circuit to be easily designed and a dead space to be reduced.

Figure 7A:
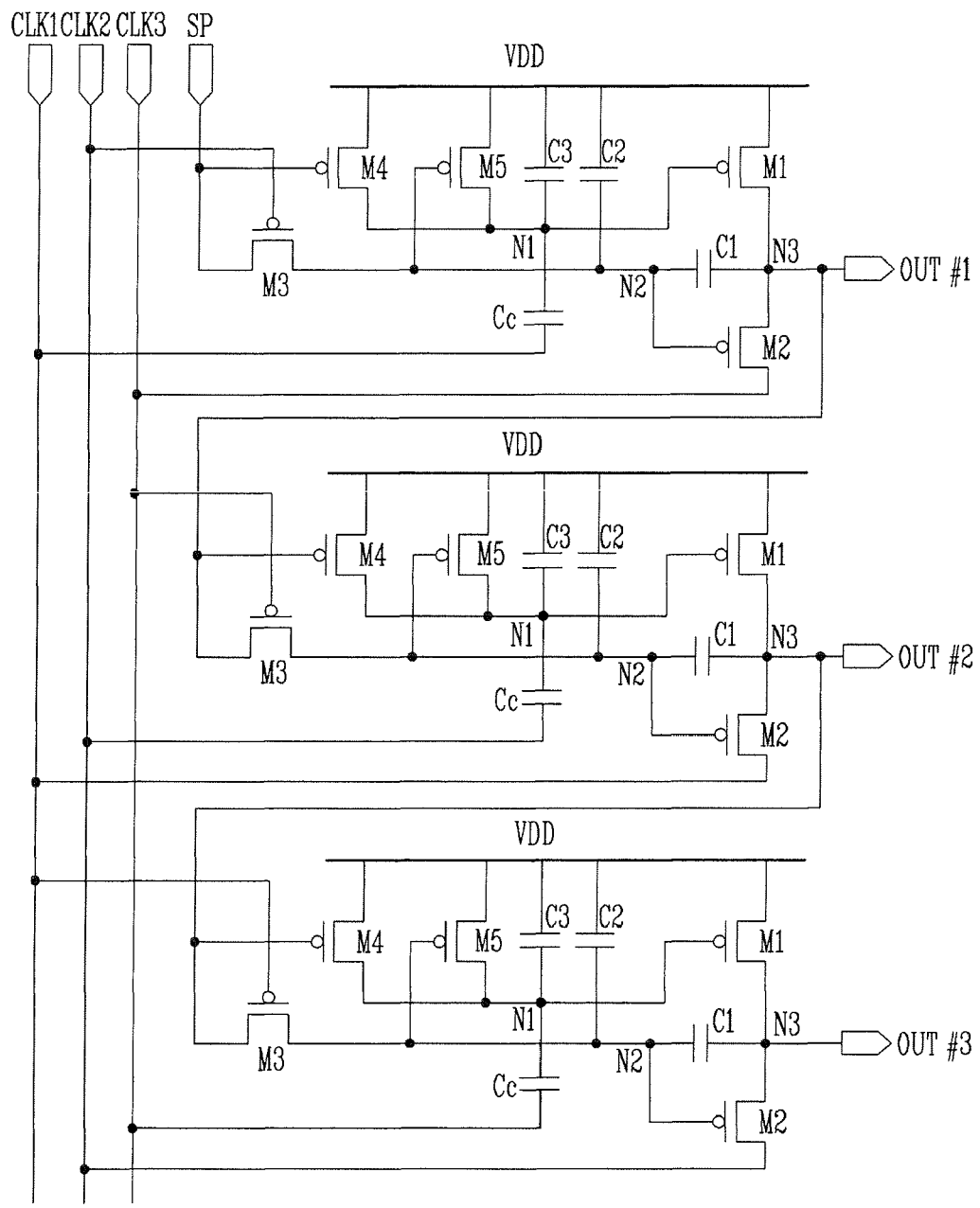
FIG. 7A is a circuitry diagram implementing the representative stage STi' shown in FIG. 6 of the shift register shown in FIG. 3.

FIG. 7A is a circuitry diagram implementing the representative stage STi' shown in FIG. 6 of the shift register shown in FIG. 3. FIG. 7B is a view showing a simulation result of the circuit shown in FIG. 7A.

With reference to FIG. 7A a shift register is arranged using the representative stage STi' of the aspect shown in FIG. 6. As shown, three representative stages STi' are connected. With reference to FIG. 7B, the shift register of FIG. 7A sequentially shifts a phase of the start pulse SP supplied thereto according to the first, second, and/or third clock signals CLK1, CLK2, and/or CLK3, which are sequentially phase-delayed. Accordingly, the shift register implemented with the representative stage STi' obtains similar results as those of the shift register implemented with the representative stage STi.

In various aspects, discussion of a signal includes aspects having one or more signals and vice versa.

Although discussed in terms of an organic light emitting display, aspects of the present invention also include other displays, such as liquid crystal displays and/or similar devices.

In various aspects, the p-type transistor may be a field effect transistor, or equivalent.

In various aspects, the stages have first, second, and third clock signal input lines an input line and an output line, wherein the input line of each stage is connected to the output line of the previous stage or the start pulse input line, and the input line corresponds to one of the first, second, and third clock signal input lines, and a voltage level controller to control voltage levels of the each stage according to an input line signal and a clock signal of the corresponding clock signal input line to output a pulse signal that corresponds to a clock signal of another one of the first, second, and third clock signal input line, as shown in FIGS. 4 and 6, for example.

As is clear from the foregoing description, the shift register according to aspects of the present invention may ease designing of a shift register, reduce a dead space, and obtain reliable operation characteristics by reducing wires of a power supply line.

Further, by forming most, if not all transistors included in the shift register as P-type transistors, an active matrix type organic light emitting display including P-type transistors in a pixel array can be more easily manufactured.

Although a few aspects of the present invention have been shown and described, it would be appreciated by those skilled in the art that changes might be made in the aspects without departing from the principles and spirit of the invention, the scope of which is defined in the claims and their equivalents.

What is claimed is:

1. A shift register comprising a plurality of stages coupled to a start pulse input line, at least one of the stages comprising:
   first, second, and third nodes;
   a voltage level controller configured to control voltage levels of the first and/or second nodes according to a start pulse or an output signal of a previous stage and a second clock signal;
   a control capacitor coupled between the first node and an input line of a first clock signal, and configured to reduce a voltage of the first node according to the first clock signal applied to the control capacitor prior to application of the start pulse or the output signal of the previous stage;
   a first transistor coupled between a first power supply and the third node that is an output node of the stage and comprises a gate electrode coupled to the first node; and
   a second transistor coupled between the third node and an input line of a third clock signal and comprises a gate electrode coupled to the second node.

2. The shift register as claimed in claim 1, wherein the control capacitor is configured to reduce the voltage of the first node when the first clock signal of a low level is inputted to the control capacitor.

3. The shift register as claimed in claim 1, wherein the voltage level controller comprises:
   a third transistor coupled between an input line of the start pulse or the output signal of the previous stage and the second node and comprises a gate electrode coupled to an input line of the second clock signal;
   a fourth transistor coupled between the first power supply and the first node and comprises a gate electrode coupled to the input line of the start pulse or the output signal of the previous stage; and
   a fifth transistor coupled between the first power supply and the first node and comprises a gate electrode coupled to the second node.

4. The shift register as claimed in claim 3, wherein the third, fourth, and/or fifth transistors are P type transistors.

5. The shift register as claimed in claim 1, wherein the voltage level controller is configured to control the voltage level of the second node according to the start pulse or the output signal of the previous stage and the second clock signal, and
   to control the voltage level of the first node according to the start pulse or the output signal of the previous stage and the voltage level of the second node.

6. The shift register as claimed in claim 1, wherein the first and/or second transistors are P-type transistors.

7. The shift register as claimed in claim 1, wherein the first, second, and third clock signals have a waveform of a sequentially delayed phase.

8. The shift register as claimed in claim 1, further comprising a first capacitor coupled between the second node and the third node.

9. The shift register as claimed in claim 1, further comprising a second capacitor coupled between the first power supply and the first node, and a third capacitor coupled between the first power supply and the second node.

10. An organic light emitting display, comprising:
    a pixel portion comprising a plurality of pixels electrically connected to scan lines and data lines;
    a scan driver comprising a shift register, and configured to sequentially apply scan signals to the scan lines; and
    a data driver configured to apply a data signal to the data lines,
    wherein the shift register comprises a plurality of stages coupled to a start pulse input line, at least one of the stages comprising:
    first, second, and third nodes;
    a voltage level controller configured to control voltage levels of the first and/or second nodes according to a start pulse or an output signal of a previous stage and a second clock signal;
    a control capacitor coupled between the first node and an input line of a first clock signal, and configured to reduce a voltage of the first node in response to the first clock signal applied to the control capacitor prior to application of the start pulse or the output signal of the previous stage;

a first transistor coupled between a first power supply and a third node being an output node of the stage and comprises a gate electrode coupled to the first output node; and a second transistor coupled between the third node and an input line of a third clock signal, and comprises a gate electrode coupled to the second node.

11. The organic light emitting display as claimed in claim 10, wherein the control capacitor is configured to reduce a voltage of the first node when the first clock signal is inputted to the control capacitor.

12. The organic light emitting display as claimed in claim 10, wherein the voltage level controller comprises:

a third transistor coupled between an input line of the start pulse or the output signal of the previous stage and the second node and comprises a gate electrode coupled to an input line of the second clock signal;

a fourth transistor coupled between the first power supply and the first node and comprises a gate electrode coupled to the input line of the start pulse or the output signal of the previous stage; and a fifth transistor coupled between the first power supply and the first node and comprises a gate electrode coupled to the second output node.

13. The organic light emitting display as claimed in claim 10, wherein the voltage level controller:

is configured to control the voltage level of the second node according to the start pulse or the output signal of the previous stage and the second clock signal, and to control the voltage level of the first node according to the start pulse or the output signal of the previous stage and the voltage level of the second node.

14. The organic light emitting display as claimed in claim 10, wherein the first, second, and third clock signals have a waveform of a sequentially delayed phase.

15. The organic light emitting display as claimed in claim 10, further comprising a first capacitor coupled between the second node and the third node.

16. A shift register comprising a voltage level controller, a plurality of stages that are sequentially connected, and a first stage being electrically connected to a start pulse input line, each of the first and the plurality of stages comprising:

first, second, and third clock signal input lines; and an input line and an output line, wherein the input line of the stage is connected to the output line of a previous one of the stages or the start pulse input line, and the input line corresponds to one of the first, second, and third clock signal input lines, wherein the voltage level controller is configured to control voltage levels of each of the stages according to an input line signal and a clock signal of a corresponding one of the first, second, and third clock signal input lines to output a pulse signal that corresponds to a clock signal of another one of the first, second, and third clock signal input lines, wherein the shift register comprises a power supply and is configured to output a fixed voltage level as an output signal when a clock signal of a third one of the first, second and third clock signal input lines is applied, wherein a clock signal on the first clock signal input line causes a voltage level of the first stage to be a low voltage level prior to the first stage receiving a signal via the start pulse input line, and wherein the first, second, and third clock signals are of a same level for a period prior to the first stage receiving a signal via the start pulse input line.

17. The shift register as claimed in claim 16, wherein the respective clock signals of the first, second, and the third input lines are shifted by one clock from one another.

18. An organic light emitting display comprising the shift register as claimed in claim 16, the organic light emitting display comprising:

scan lines and data lines;

a pixel portion comprising a plurality of pixels electrically connected to the scan lines and the data lines;

a scan driver comprising the shift register and configured to sequentially apply scan signals to the scan lines; and a data driver configured to apply a data signal to the data lines.

19. The organic light emitting display as claimed in claim 18, further comprising a substrate, wherein the shift register and the pixels comprise transistors of the same conduction type so that the shift register and the pixels are simultaneously formable on the substrate.

* * * * *

UNITED STATES PATENT AND TRADEMARK OFFICE
CERTIFICATE OF CORRECTION

PATENT NO. : 8,040,293 B2
APPLICATION NO. : 11/833454
DATED : October 18, 2011
INVENTOR(S) : Jin Tae Jeong It is certified that error appears in the above-identified patent and that said Letters Patent is hereby corrected as shown below:

On the Title Page

(56) References Cited, Other Publications, lines 2-3

Delete

"Communication issued by the European Patent Office on Apr. 29, 2009. Japanese Office Action dated Jan. 12, 2010, in corresponding Japanese Patent Application No. 2007-013531."

Insert

-- Communication issued by the European Patent Office on Apr. 29, 2009. --

-- Japanese Office Action dated Jan. 12, 2010, in corresponding Japanese Patent Application No. 2007-013531. --

(56) References Cited, Other Publications, line 6

Delete "Jun. 9 2010," Insert -- Jun. 9, 2010, --

In the Claims

Column 12, Claim 4, line 28

Delete "P type" Insert -- P-type --

Column 13, Claim 10, line 6

Delete "output"

Column 13, Claim 12, line 27

Delete "output"

Signed and Sealed this
Twenty-sixth Day of November, 2013

Margaret A. Focarino
*Commissioner for Patents of the United States Patent and Trademark Office*